United States Patent [19]

Ritchie et al.

[11] 4,220,382

[45] Sep. 2, 1980

[54] BUSSING CONNECTOR

[75] Inventors: Leon T. Ritchie, Mechanicsburg; John A. Woratyla, Camp Hill, both of Pa.

[73] Assignee: AMP Incorporated, Harrisburg, Pa.

[21] Appl. No.: 970,089

[22] Filed: Dec. 15, 1978

[51] Int. Cl.[3] .......... H05K 1/07

[52] U.S. Cl. .......... 339/17 LM; 339/74 R; 361/407

[58] Field of Search .......... 339/17 M, 17 LM, 74 R, 339/176 MP; 361/407, 412, 413, 415

[56] References Cited

U.S. PATENT DOCUMENTS

| | | | |
|---|---|---|---|
| 3,351,876 | 11/1967 | Conrad | 361/407 |
| 3,368,117 | 2/1968 | Pond et al. | 361/407 |
| 3,590,330 | 6/1971 | Teagno et al. | 361/17 M |
| 3,858,163 | 12/1974 | Goodman et al. | 361/413 |
| 3,899,234 | 8/1975 | Yeager et al. | 339/74 R |

FOREIGN PATENT DOCUMENTS

| | | | |
|---|---|---|---|
| 1118852 | 12/1961 | Fed. Rep. of Germany | 339/74 R |

*Primary Examiner*—Neil Abrams
*Attorney, Agent, or Firm*—Russell J. Egan

[57] ABSTRACT

An improved bussing connector is disclosed for interconnecting a plurality of printed circuit boards and the like by means of simple blanked metal strips loaded into an appropriate housing. The subject bussing connector can be used in combination with many varieties of housings to appropriately bus pads of stacked printed circuit boards for signal, ground and power interconnection. In a further embodiment of the bussing connector, a cam can be utilized to provide zero insertion mating with the bus connector.

7 Claims, 9 Drawing Figures

BUSSING CONNECTOR

BACKGROUND OF THE INVENTION

1. The Field of the Invention

The present invention relates to bussing connectors used for interconnecting a plurality of like devices and in particular to a system for interconnecting contact pads of a plurality of stacked printed circuit boards.

2. The Prior Art

The introduction and implementation of the micro processer has amplified the need for bus oriented interconnecting systems. In almost all applications micro processers are totally bus organized, that is the micro processer chip itself, random access memory, read only memory, serial IO devices, parallel IO devices, and other devices are all connected to the same bus. The bus in essence is a series of parallel lines to which each of the above devices are attached. If the system is small enough, the bus can be implemented in a relatively straight forward fashion. It simply becomes parallel lines etched on a printed circuit board. If, however, for one reason or another, usually dependent upon system size, the system cannot be implemented on a single board the problem then becomes more complex and the bus must then be carried on from printed circuit to printed circuit board.

There are a number of ways in which circuit board to circuit board interconnect can be accomplished. For example, in a typical system using standard edge board connectors the bus would be carried through a mother board or back plane and the individual daughter boards connected thereto. Examples of this can be found in U.S. Pat. Nos. 3,651,432; 3,651,444; and 3,864,000. As an alternative, the boards could be interconnected through a daisy chain of connectors on a single ribbon cable as shown, for example, in U.S. Pat. No. 3,727,168. A further approach to the problem would be a stackable connector system which would allow connecting the bus from board to board as shown in either U.S. Pat. Nos. 4,028,794 or 4,050,758. Although each of these systems have particular advantages, they have the significant disadvantage of being rather costly due to the large number of parts necessary to effect proper interconnection.

Another problem of interconnecting printed circuit boards in parallel is the distribution of power to the circuits. Although any one circuit board in the system may require relatively low power, typically in the neighborhood of 5 to 10 amps, a bus supply to several circuit boards must carry fairly high currents. Any of the above mentioned techniques, including the mother board with standard edge board connectors, daisy chaining, or stacking ZIF connectors are limited in terms of current capability.

Still another problem that must be addressed in some micro processer systems, although not all of such systems, is that of speed. Some micro processers and some computer systems are designed to operate at high speeds which dictates the need for controlled impedance.

SUMMARY OF THE INVENTION

The subject bussing connector includes at least one strip of edge board engaging terminals that is stamped and formed from a continuous web of conductive material and mounted in an appropriate housing so as to engage an edge portion of a plurality of parallel spaced printed circuit boards or the like. The terminal strip can be formed with terminals extending in opposite directions from marginal edges of a web of conductive material thereby producing a bussing connector system capable of engaging two stacks of printed circuit boards or the like. The subject terminal strip can further be used in combination with a camming means which will allow spreading of contact arm portions of the terminal prior to insertion of the printed circuit board therebetween. The configuration of the subject terminal strip allows for adequate material to handle high current bussing as well as sufficient area to carry capacitive shielding for controlled impedance applications.

It is therefore an object of the present invention to produce an improved bussing system that can accommodate high current situations for power distribution to a plurality of circuit boards.

It is another object of the present invention to produce a bussing system which can include a controlled impedance.

It is still another object of the present invention to produce a bussing system which can interconnect a plurality of printed circuit boards from one or both sides of the system.

It is a further object of the present invention to produce a bussing interconnect system utilizing an inexpensive stamped and formed terminal strip which can be produced in great length, cut to suitable lengths, and mounted in relatively inexpensive insulated housings thereby producing a most economical configuration.

It is a still further object of the present invention to produce an improved bussing interconnect system which can be readily and economically manufactured.

The means for accomplishing the foregoing objects and other advantages will become apparent to those skilled in the art from the following detailed description taken with reference to the accompanying drawings.

BRIEF DESCRIPTION OF THE DRAWINGS

FIG. 8 is a perspective view, partially in section, showing details of the terminal strip and housing of the embodiment of FIG. 7.

DETAILED DESCRIPTION

Figure 1:
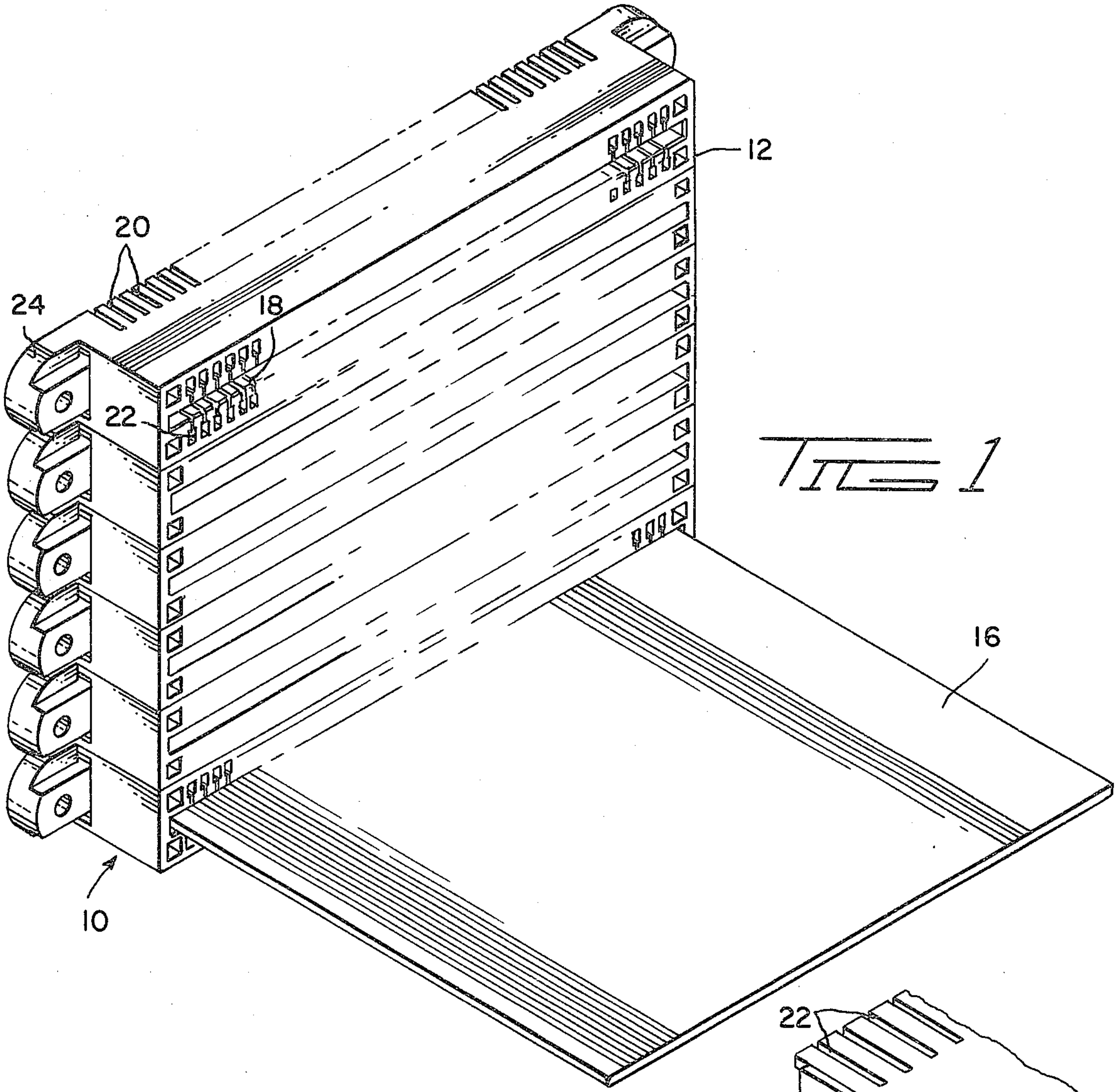
FIG. 1 is a perspective view of a first embodiment of the subject invention.
Figure 2:
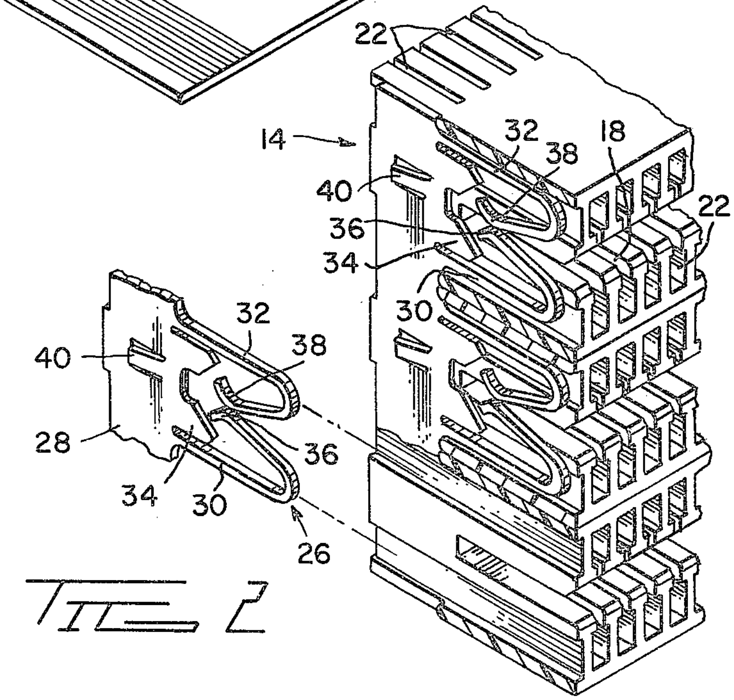
FIG. 2 is a perspective view, partially in section, showing details of the terminal strip and housing of the embodiment of FIg. 1.

A first embodiment of the subject bussing connector system 10 is shown in FIGS. 1 and 2 as an assembly of identical housing members 12 with a plurality of terminal strips 14 mounted therein so as to accommodate edge portions of a plurality of circuit boards 16. Each of the housings 12 is an elongated member of insulative material having an elongated board receiving slot 18 in one face thereof and a plurality of transverse terminal receiving slots 20 along an opposite face thereof. The slots 20 each interconnect with a terminal passage 22 opening into the cavity 18. Each housing 12 is further provided with mounting means 24.

The terminal strip 14 is stamped and formed from a continuous web of conductive material to form a plurality of terminals 26 extending from at least one marginal edge of carrier strip 28. Each terminal 26 has a pair of spring contact arms 30, 32 extending from opposite sides of profiled base portion 34. The arms 30, 32 are bent upon themselves and have a contact protrusion 36, 38, respectively inwardly directed near the free ends thereof. The profiled base portion also includes a locking lance 40.

The system shown in FIGS. 1 and 2 would be assembled by first determining the number of circuit board interconnects that are to be made. Then a suitable number of housings 12 would be assembled in sandwich fashion and terminal strips 14 of the appropriate length loaded into slots 20 of the assembly at the positions where it was desired to accomplish bussing. The terminal strips 14 would serve to hold the stacked housings together in the assembled condition as well as to provide the desired bussing. The assembled system could then be mounted on a desired surface and the circuit boards 16 appropriately inserted therein.

Figure 3:
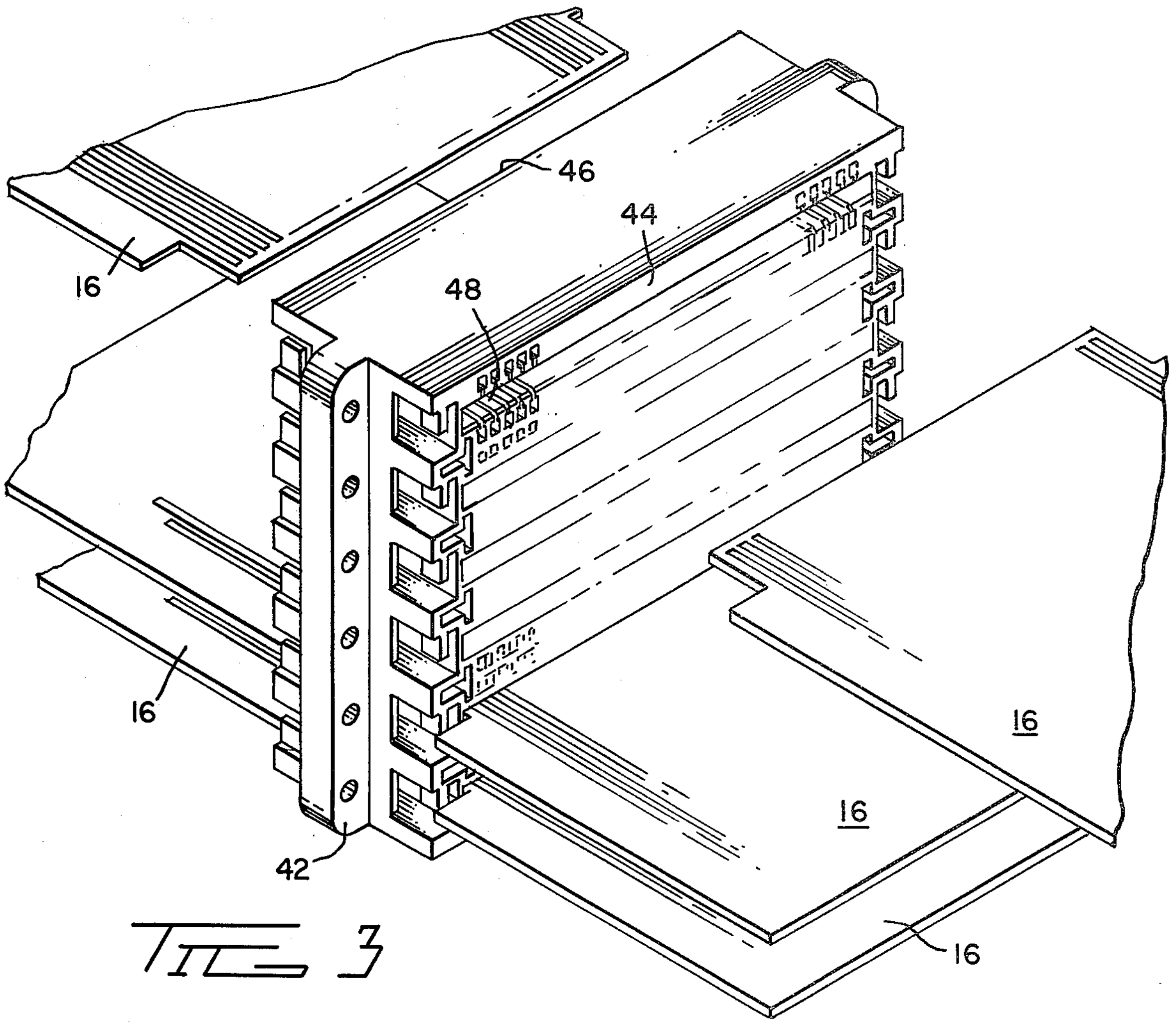
FIG. 3 is a perspective view of a second embodiment of the subject invention.
Figure 4:
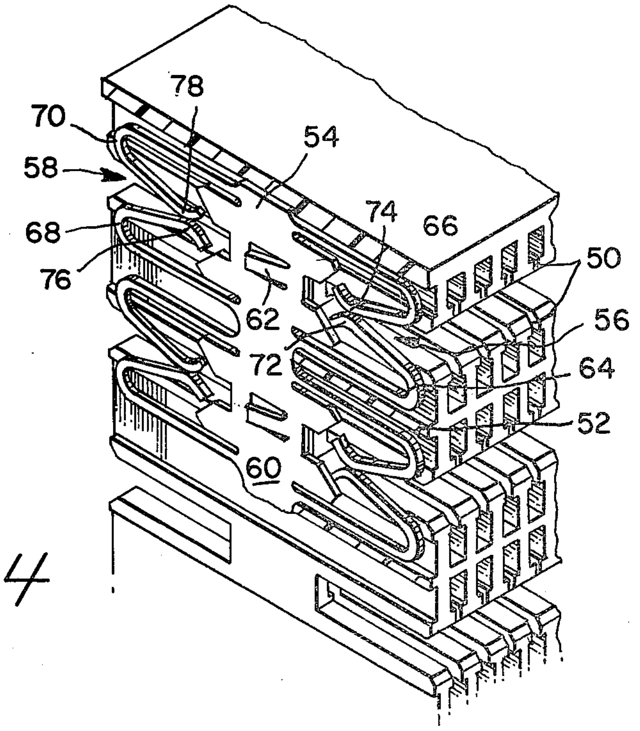
FIG. 4 is a perspective view, partially in section, showing details of the housing and terminal strip of the embodiment of FIG. 3.

The second embodiment of the present invention is shown in FIGS. 3 and 4 and is capable of receiving circuit boards from two sides. In this embodiment the housing 42 is formed as a unitary block of insulative material, rather than the plurality of individual housings 12 shown in FIGS. 1 and 2, with first and second oppositely directed faces 44, 46. Each face 44, 46 has therein a series of elongated, parallel, spaced apart edge board receiving apertures 48 which extend through the housing 42 between mating faces 44, 46. A plurality of parallel, spaced transverse grooves 50 open on each elongated side of each slot 48 of the first face 44. The grooves of adjacent slots in the first face are separated by webs 52 while the grooves in the second face are open to form an elongated transverse slot. The terminal strip 54 for this embodiment is somewhat similar to the terminal strip 14 except that a plurality of identical terminals 56, 58 extend in opposite directions from a center bussing web 60 which includes at least one locking lance 62. Each of the terminal portions 56, 58 has a pair of spring contact arms 64, 66, 68, 70, respectively, having contact points 72, 74, 76, 78 adjacent the free ends thereof.

The second embodiment is assembled by slipping the terminal strip 54 into the housing 40 from the second face 46 thereof until the latching tines 62 engage in the center of the housing 42. The assembly is then ready to receive printed circuit boards 16 from either or both sides of the assembly to effect the appropriate bussing of the circuit boards.

Figure 5:
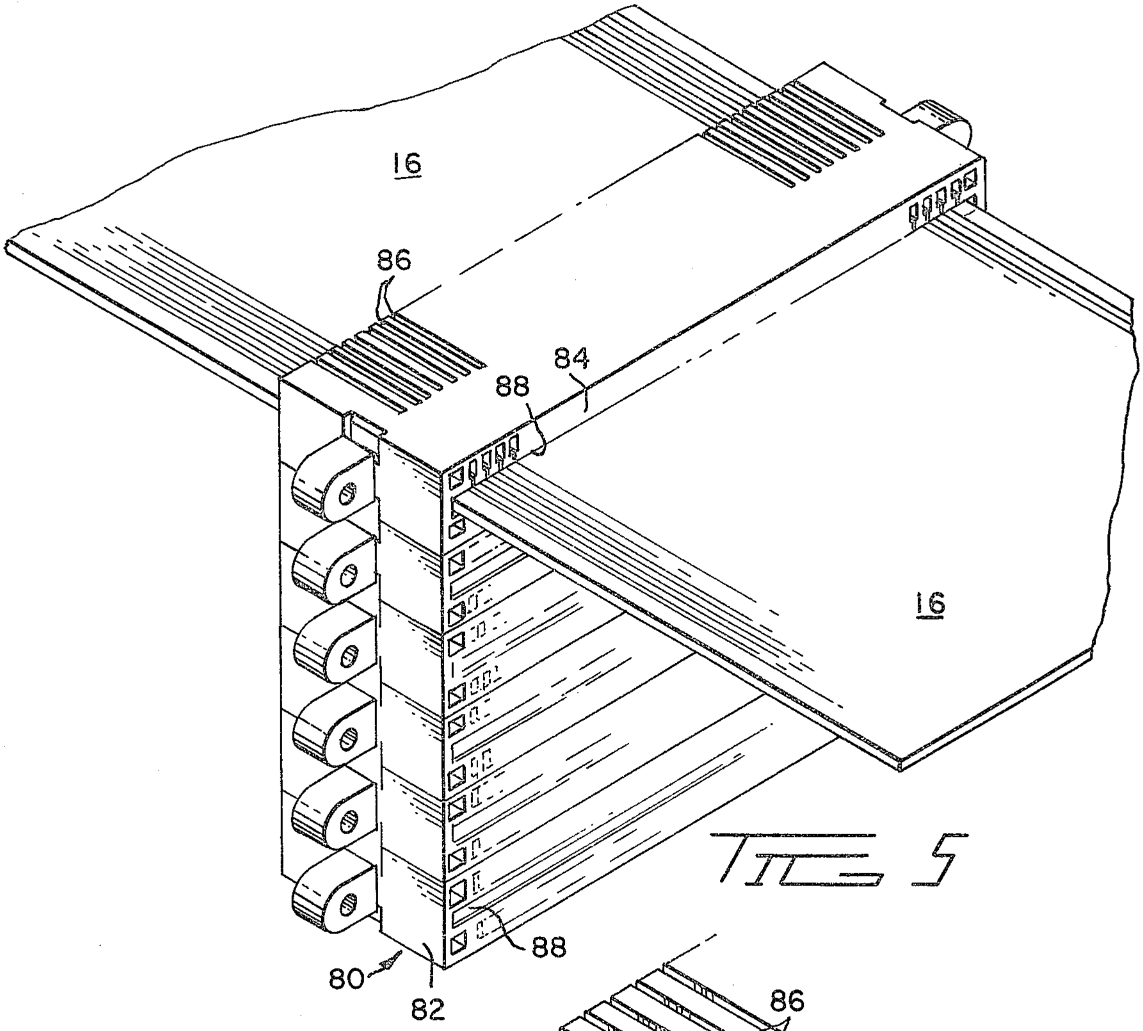
FIG. 5 is a perspective view of a further alternate embodiment of the subject invention.
Figure 6:
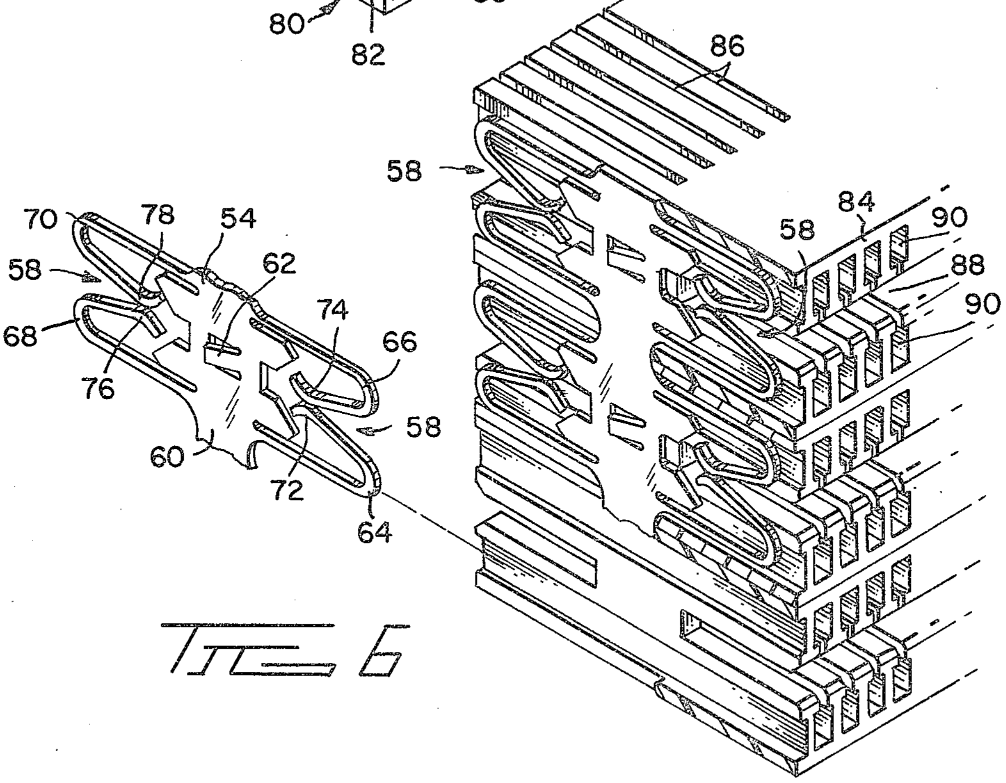
FIG. 6 is a view, partially in section, showing details of the terminal strip and housing of the embodiment of FIG. 5.
Figure 6:
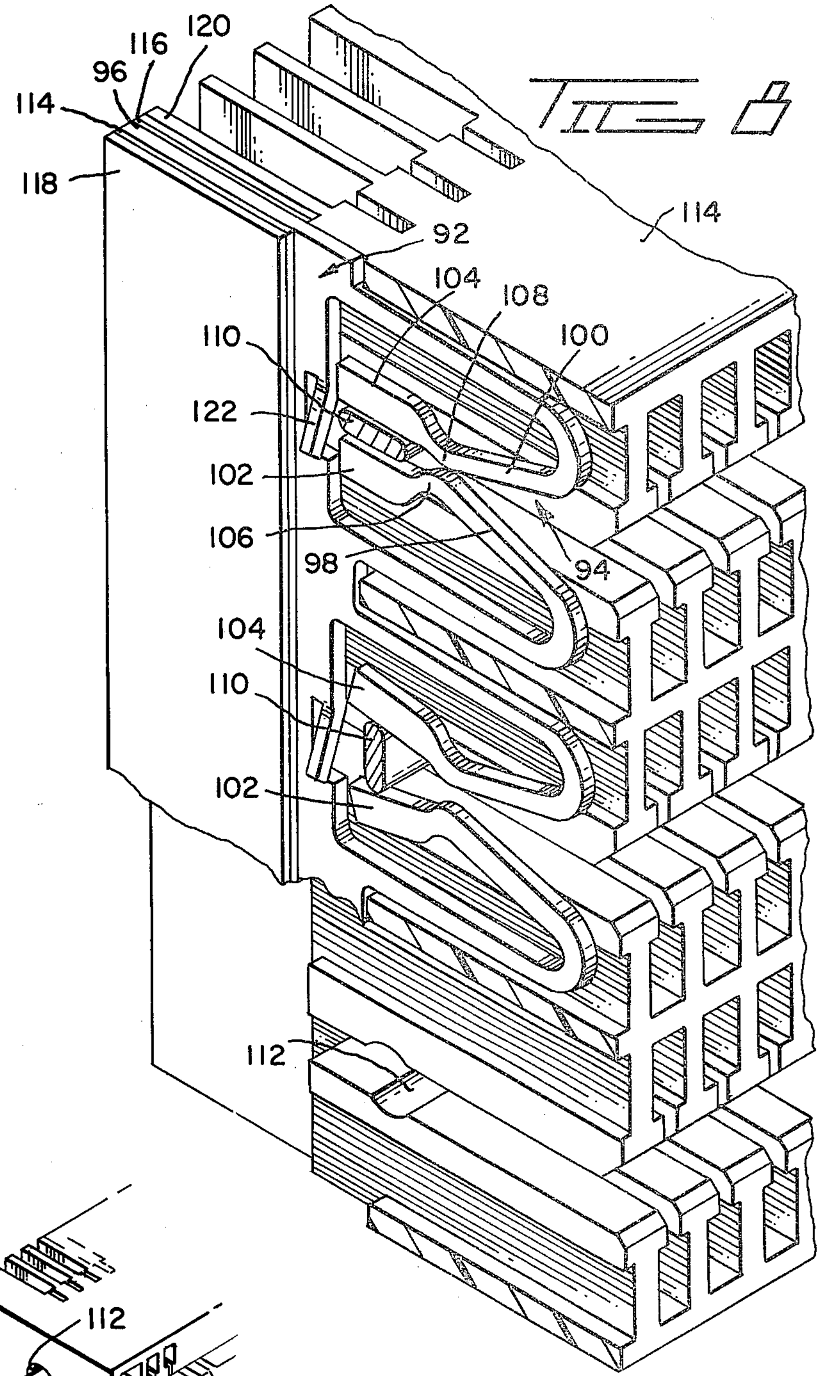

FIGS. 5 and 6 shows an embodiment which includes features of both the previously described embodiments. The housing 80 is comprised of a plurality of individual housing units 82 that are stacked together in the fashion of the first embodiment. Each of the housing units 82 has a first and second mating face 84, 86, each with an elongated board receiving aperture 88 and transversely extending grooves 90 which are similar to apertures 48 and grooves 50. The terminal strip 54 is identical with the previously discussed double sided terminal strip used in the second embodiment of the present invention.

Figure 9:
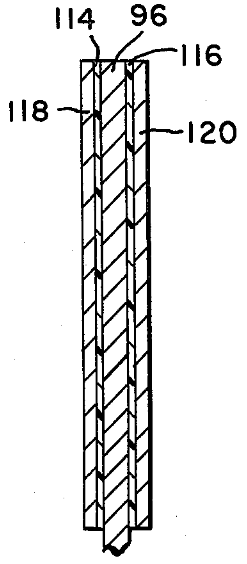
FIG. 9 is a transverse section through a portion of the terminal strip of FIG. 8.
Figure 7:
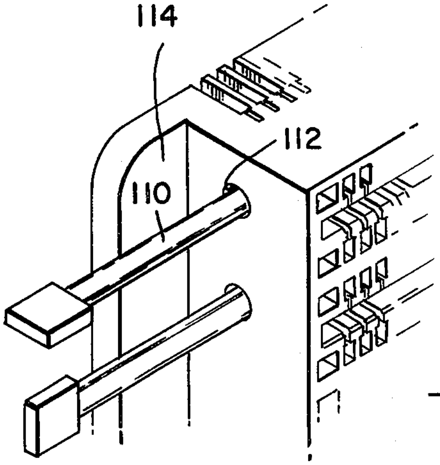
FIG. 7 is a perspective view of an end portion of a further alternative embodiment of the present invention.

The embodiment of the subject invention shown in FIGS. 7 to 9 includes two features not shown in the previous embodiments. The first of these features is a zero entry feature and the second feature is an impedance matching feature. The terminal strip 92 is formed with a plurality of terminals 94 extending from one marginal edge of a carrier web 96. Each terminal has a pair of spring arms 98, 100 each with an enlarged pad 102, 104 at the free end beyond contact bump 106, 108, respectively. An elongated cam member 110 is mounted in bore 112 of the housing 114 to lie between the pads 102, 104. The transverse section of the cam 110 is such that a first position allows the spring arms 98, 100 to be in their normal board engaging condition with the contact points 106, 108 close together as shown by the upper most terminal 94. Rotation of the cam 110 by 90°, as shown by the lower terminal in FIG. 8, causes the cam to engage the enlarged ends 102, 104 of the terminal and to spread the contact points 106, 108 sufficiently to allow entry of a printed circuit board therebetween without a wiping action occurring. It should be noted here that other types of cam configurations could equally be utilized since it is only necessary for the cam to spread the contact arms. Further, the zero entry could be made a feature of double sided terminal strips.

Impedance matching is accomplished in this embodiment by bonding strips of insulation 114, 116 on opposite sides of the carrier portion 96 of the terminal strip 92 and a layer of metallization 118, 120 on the outside of the insulation. This could most be conveniently accomplished by bonding a strip of metallized flexible insulative material such as Mylar to the opposite sides of the center web 96. The layers of metal 118, 120 provide capacitance for controlled impedance in the bus lines where speed is important. While metal layers on both sides of the carrier is shown, clearly the metal layer could be added to one or both sides, as conditions demanded, and utilized with single or double sided terminal strips. It should also be noted that the locking lance 122 has been turned 90° from the other embodiments to allow extra space for the metal layers.

The present invention may be subject to many modifications and changes without departing from the spirit or essential characteristics thereof. The present embodiment should therefore be considered in all respects as illustrative and not restrictive of the scope of the invention.

We claim:

1. A bussing system comprising:

a housing having first and second oppositely directed mating faces each defining at least two elongated, parallel, spaced circuit board receiving apertures extending completely through said housing to open on both mating faces;

at least one transversely extending, terminal strip receiving groove in said housing intersecting each said aperture;

a plurality of terminal strips each adapted to be mounted in a respective one of said grooves, each said terminal strip having a plurality of identical terminal portions extending in both directions from marginal edges of a carrier web, each said terminal portion lying in the plane of said strip and having a profiled base defining a central board receiving recess and a pair of cantilever spring arms extending outwardly from opposite ends of said profiled base defining a circuit board receiving space therebetween leading to said recess, each said spring arm being doubled upon itself and having a protrusion on the adjacent edge portions of said arms directed to engage respective sides of a circuit board, said terminal portions being spaced sufficiently to be received on a respective aperture whereby circuit boards received in said system will have like portions thereof bussed together by said terminal strips whereby said system can accommodate circuit boards entering from both sides thereof.

2. A bussing system according to claim 1 wherein said housing comprises:

an assembly of individual housing units each having a single elongated board receiving aperture and a plurality of transverse terminal strip receiving grooves intersecting said aperture.

3. A bussing system according to claim 1 wherein said carrier web of at least one of said terminal strips is of sufficient cross sectional area to accommodate passage of large electrical currents.

4. A bussing system according to claim 1 further comprising:

an insulative web and a metal strip bonded to at least one side of the carrier web of at least one of said terminal strips whereby capacitance is provided for impedance matching purposes.

5. A bussing system according to claim 4 wherein said metal strip is plated on said insulative web.

6. A bussing system according to claim 1 further comprising:

cam means mounted in said housing and adapted to act on said terminal portions of said terminal strip to effect an opening and closing thereof for zero insertion force operation.

7. A bussing system according to claim 6 wherein:

each terminal portion of said terminal strip comprises a profiled base portion integral with said carrier web, a spring contact arm extending in cantilever fashion from said web at each end of said base portion, said arms being bent upon themselves in the direction of the opposite arm and having a contact protrusion intermediate the free end and the bight of said bend, said protrusions being aligned and oppositely directed to define therebetween a distance less than the normal circuit board thickness, and an elongated cam member rotatably mounted in said housing extending between the free ends of said arms, said cam member having an elongated section the lesser dimension of which allows said arms to assume their normal closely spaced condition and the larger dimension of which drives said arms to a spaced condition allowing insertion of a circuit board without encountering contact resistance.

* * * * *